United States Patent [19]

Tuthill

[11] Patent Number: 5,008,671
[45] Date of Patent: Apr. 16, 1991

[54] HIGH-SPEED DIGITAL-TO-ANALOG CONVERTER WITH BIMOS CELL STRUCTURE

[75] Inventor: Michael G. Tuthill, Limerick, Ireland

[73] Assignee: Analog Devices, Incorporated, Norwood, Mass.

[21] Appl. No.: 211,707

[22] Filed: Jun. 27, 1988

[51] Int. Cl.[5] .............................................. H03M 1/78
[52] U.S. Cl. ..................... 341/136; 341/136; 341/154; 307/570
[58] Field of Search ............... 341/127, 133, 134, 135, 341/136, 144, 153, 154; 307/570, 573, 575, 577, 495, 499

[56] References Cited

U.S. PATENT DOCUMENTS

| 4,141,004 | 2/1979 | Craven | 341/133 |
| 4,381,499 | 4/1983 | Struthoff | 341/154 |
| 4,405,916 | 9/1983 | Hornak et al. | 341/144 |
| 4,558,242 | 12/1985 | Tuthill et al. | 341/136 |
| 4,573,036 | 2/1986 | Wondra | 341/135 |
| 4,590,456 | 5/1986 | Burton et al. | 341/133 |
| 4,644,325 | 2/1987 | Miller | 341/133 |
| 4,683,458 | 7/1987 | Hallgreen | 341/127 |
| 4,725,813 | 2/1988 | Miyada | 341/136 |
| 4,751,497 | 6/1988 | Torii | 341/154 |

Primary Examiner—A. D. Pellinen
Assistant Examiner—H. L. Williams
Attorney, Agent, or Firm—Parmelee, Bollinger & Bramblett

[57] ABSTRACT

A digital-to-analog converter comprising a set of identical DAC cells each including: (1) a PNP bipolar current source transistor producing a continuous output current (equal values for all DAC cells), (2) a pair of PMOS switches connected to the collector of the bipolar transistor to divert the output current to either a ground line or a corresponding node of an R/2R ladder, (3) ladder circuitry for maintaining the full-scale ladder voltage below a predetermined level which keeps the PMOS switches in the saturated region of their characteristics, and (4) make-before-break switch control circuitry to close the PMOS switch being activated prior to opening the other PMOS switch.

9 Claims, 1 Drawing Sheet

HIGH-SPEED DIGITAL-TO-ANALOG CONVERTER WITH BIMOS CELL STRUCTURE

BACKGROUND OF THE INVENTION

1. Field of the Invention

This invention relates to digital-to-analog converters (DACs). More particularly, this invention relates to monolithic converters especially suitable for use as part of a single-chip analog I/O system, providing a complete interface between a microprocessor and the analog world. This invention provides improved converter performance including faster speed and reduced errors.

2. Description of the Prior Art

A wide variety of DACs have been proposed over the years, and some have gone into extensive commercial use. One early converter using discrete transistors is described in U.S. Pat. No. 3,685,045 (Pastoriza) which shows PNP current source transistors driving an R/2R ladder network; the transistor current sources are turned on or off by a code-controlled circuit connected to each transistor emitter. U.S. Pat. No. 3,961,326 (Craven) shows an IC converter using a bipolar differential switch pair for steering the current of a current source transistor to either a summing bus or a ground line; the emitter areas of the current source transistors are proportioned to the magnitude of the respective bit current. U.S. Pat. No. 4,323,795 (Holloway, et al) shows a monolithic DAC somewhat similar in design to the discrete converter of the '045 patent referred to above; PNP transistor current sources directly drive an R/2R ladder and are turned on or off by circuitry connected to the transistor emitters.

Although the converters shown in the above-mentioned prior art patents have performed well in many circumstances, their capabilities have been found lacking in important respects when used in more modern applications, particularly when used as part of a high-speed interface for a microprocessor-based data acquisition system. Accordingly, it is a principal object of this invention to provide a digital-to-analog converter having significant improvements over prior art designs particularly with respect to operational characteristics such as speed and error rate.

SUMMARY OF THE INVENTION

In a preferred embodiment of the invention, to be described hereinbelow in detail, there is provided a digital-to-analog converter which includes a plurality of identical high-speed DAC cells comprising current sources developing equal-valued continuous output currents. The current sources are PNP transistors which, producing equal output currents, can be of minimum emitter size, with small die area and capable of high speed performance.

The source currents are steered by PMOS switches to either ground or a corresponding node on an R/2R ladder network. The arrangement provides that the total current in the ground (reference) line and the voltage supply line are maintained at a constant value independently of the input code. The PMOS switches advantageously are kept in saturated condition, so that there is minimal change in voltage at the current source transistors with changes in voltage at the ladder network. The PMOS switches also are controlled in such a way as to provide make-before-break sequencing, further minimizing voltage variations at the current source transistors due to code transitions and thereby correspondingly reducing anomalies in the DAC output.

BRIEF DESCRIPTION OF THE DRAWING

The single drawing is a schematic diagram showing the relevant portions of a digital-to-analog converter in accordance with the present invention.

DESCRIPTION OF THE PREFERRED EMBODIMENT

Figure 1:
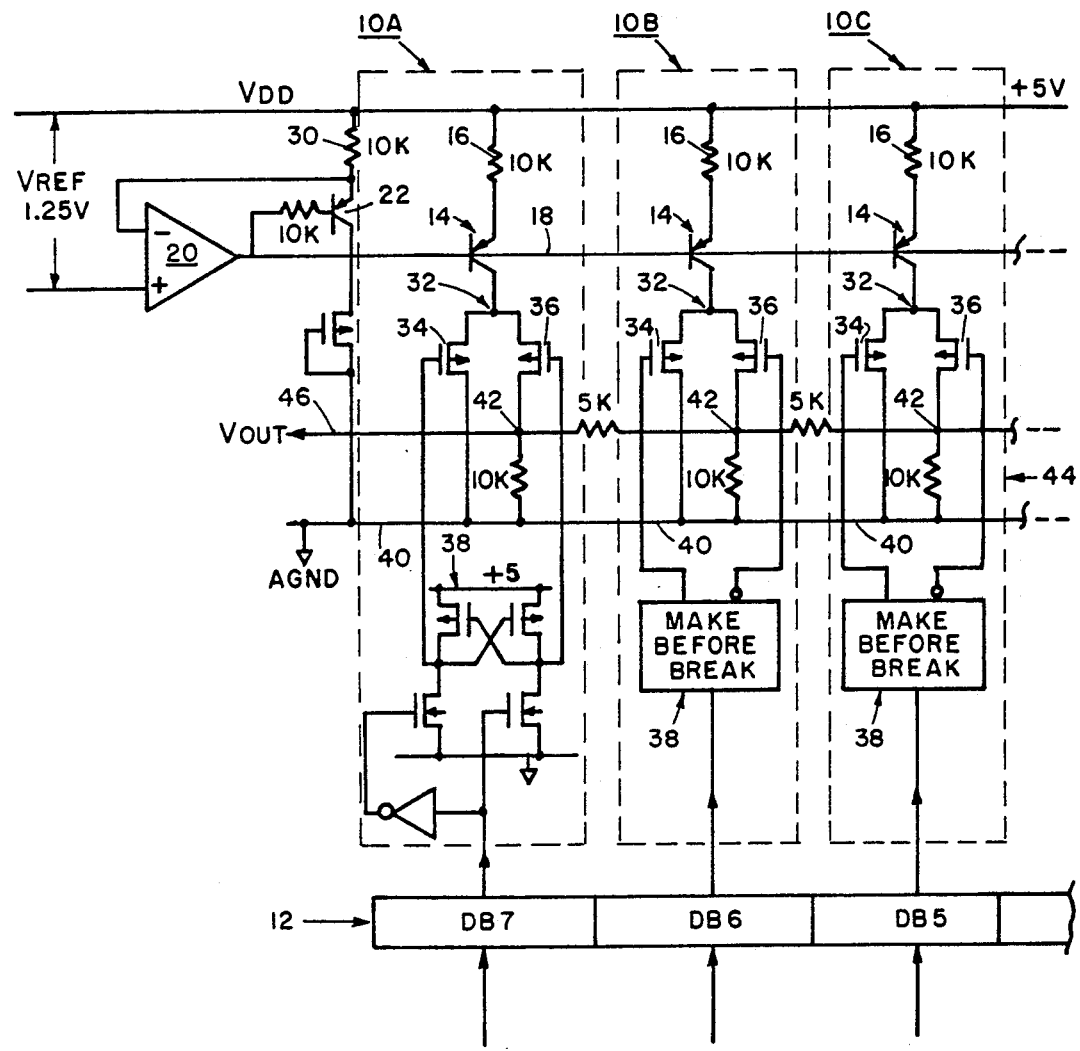

Referring now to the drawing, the preferred digital-to-analog converter in accordance with the invention comprises a set of identical DAC cells 10A, B, C. Only those cells for the top three bits of the DAC are shown, but it should be understood that a converter for the intended application typically will have the capability of handling at least 8 bits of input code, with a corresponding DAC cell 10 for each bit. Each DAC cell receives a data bit signal (DB7, DB6, etc.) from an input register 12 which stores the successive input codes.

Each of the DAC cells 10 comprises a PNP transistor current source 14 having a resistor 16 connected between the emitter and a voltage supply line $V_{DD}$ (e.g. +5 volts). The PNP bases are connected to a common line 18 driven by an op amp 20 arranged in known fashion to control the difference voltage between the $V_{DD}$ line and the base line 18 so as to maintain a constant current through a reference transistor 22 identical to the other PNP transistors. The input of the op amp 20 receives a reference voltage (preferably 1.25 volts) derived in the preferred embodiment from a conventional band-gap voltage source (not shown). The amplifier input also receives an opposing voltage developed across a reference emitter resistor 30.

The op amp 20 automatically adjusts the voltage of the base line 18 so as to maintain the current through the reference resistor 30 constant (at 125 $\mu$a in the disclosed embodiment. The so-adjusted base line voltage serves to correspondingly maintain constant the currents through the other transistors 14, also at 125 $\mu$a in the disclosed embodiment. Since no scaling of current sources is required, all of the bipolar transistors are of minimum emitter size, with small die area and high speed. In addition, the current flowing in the supply voltage line $V_{DD}$ and the ground line (AGND) are maintained constant, independent of the DAC code, thus minimizing errors due to metal IR drops.

The collectors of the PNP transistors 14 are connected to respective input terminals of a set of steering switch means generally indicated at 32. Each switch means comprises a pair of P-channel (PMOS) cascode switches 34, 36 with their source electrodes connected together to form the switch means input terminal and their drain electrodes serving as the switch output terminals. The gates of the PMOS switch pairs 34, 36 are controlled by MOS switch control circuitry 38, e.g. as shown in detail for the first DAC cell 10A. This circuitry in turn responds to the respective data bit from the input register 12 serving to turn one switch 34 on and the other switch 36 off for one data bit logic state, and vice versa for the other logic state.

Each pair of PMOS switches 34, 36 performs a current steering function so as to divert the collector current of the corresponding PNP current source 14 alternatively either to a reference line 40 (typically ground) or to a corresponding node 42 of an R/2R ladder network generally indicated at 44. When current from a current source 14 is diverted by the PMOS switch from ground to the ladder network, a corresponding incremental increase in ladder output voltage is developed at its output line 46. The magnitude of the increment is determined by the binary weighting of the particular data bit which has gone high.

With the circuit arrangement described, and the parameter values shown, the full-scale output voltage (i.e. the maximum output voltage on the ladder output line 46) will be 1.25 volts, which is less than the threshold voltage of the PMOS switches. This low full-scale voltage on the DAC thus ensures that the PMOS current-steering transistors 34, 36 always operate in the saturation region of their characteristics. More specifically, holding the maximum output to be no more than 1.25 volts assures that the PMOS drain does not become more positive than its gate by an amount equal to $V_{TBS}$ of the PMOS switch. ($V_{TBS}$ is the normal threshold voltage $V_T$ increased slightly by the Bulk-Source VBS; the latter sometimes also is referred to as the Backgate-Source voltage or the Substrate-Source voltage.)

Since the PMOS transistors are maintained in saturated condition, changes in voltage at the ladder 44 have hardly any effect on the PMOS source voltages. For example, tests have shown that in saturated condition, the PMOS source voltage (which also is the collector voltage of the associated PNP current source transistor) changes only about 0.08 volts for a one-volt change in drain voltage. Accordingly, ladder voltage changes, such as caused by changes in input code, do not significantly affect the current output of the corresponding current source 14 connected to the PMOS source electrodes, thus providing improved accuracy in conversion. In effect, the PMOS switches serve to buffer the current source 14 from the effects of changes in ladder voltage. (In contrast, it may be noted that the use of NMOS current-steering switches would result in complete feed-through of any changes in drain voltage directly to the source electrode, thus causing relatively severe modulation of the DAC current sources with code, and thereby causing inaccuracy as a result of the corresponding non-linearity in the transfer function.)

The buffering action of the PMOS switches 34, 36 also helps to reduce settling time following a change in input code. That is, the collector-base and collector-substrate capacitances of the current-source transistors 14 are relatively large, so that large voltage swings on the collectors could result in excessive settling time. Minimization of voltage swings on the collector, through use of PMOS switches, improves the settling time.

The MOS switch control circuitry 38 is, in the preferred embodiment arranged to operate in a make-before-break sequence. That is, the switch 34 or 36 to be activated first closes, so as to complete its circuit from source to drain, and thereafter the other switch opens. At no time are both switches open. This further minimizes the voltage variations on the collectors of the bipolar current source transistors 14, resulting in good DC and AC performance.

Although a specific preferred embodiment has been described hereinabove in detail, it is to be understood that this is for the purpose of explaining the manner in which such embodiment operates, and is not to be considered in a limiting sense, it being understood that those skilled in this art may carry out the principle of the invention in quite different ways, for example to meet the requirements of different applications.

What is claimed is:

1. A digital-to-analog converter (DAC) with means to receive a binary input code and including a plurality of identical high-speed DAC cells each developing a continuous current output for selective connection to a corresponding input node of an R/2R ladder network to produce on the ladder output line a composite analog signal corresponding to the input code;
   each of said identical DAC cells comprising:
   (A) a bipolar transistor connected to first circuit means arranged so that said bipolar transistor serves as a current source;
   (B) MOS switch means with an input terminal connected to the output of said bipolar transistor to receive said continuous output current, said MOS switch means having a channel polarity which is the same as the polarity of the collector/emitter of said bipolar transistor, said switch means further having first and second output terminals alternatively connectable to said switch means input terminal to carry said continuous output current, said first and second output terminals being connected respectively to (1) a common reference line and (2) a corresponding input node of said R/2R ladder; and
   (C) second circuit means responsive to said input code for controlling the conditioning of the corresponding MOS switch means to activate a selected one of said output terminals to carry said continuous current of the corresponding bipolar current source either to said common reference line or to the corresponding ladder input node.

2. A digital-to-analog converter (DAC) with means to receive a binary input code and including a plurality of identical high-speed DAC cells each developing a continuous current output for selective connection to a corresponding input node of an R/2R ladder network to produce on the ladder output line a composite analog signal corresponding to the input code;
   each of said identical DAC cells comprising:
   (A) a PNP bipolar transistor having its emitter connected through a resistor to a d-c supply line the voltage of which differs from that of the base voltage of the transistor in a predeterminedly controlled fashion so that said bipolar transistor serves as a precision current source;
   (B) PMOS switch means with an input terminal connected to the collector of said bipolar transistor to receive said continuous output current, said switch means having first and second output terminals alternatively connectable to said switch means input terminal to carry said continuous output current, said first and second output terminals being connected respectively to (1) a common reference line and (2) a corresponding input node of said R/2R ladder; and
   (C) circuit means responsive to said input code for controlling the conditioning of the corresponding PMOS switch means to activate a selected one of said output terminals to carry said continuous current of the corresponding bipolar current source either to said common reference line or to the corresponding ladder input node;
   the range of output voltages developed by said ladder being maintained below a predetermined value of such magnitude that said PMOS switch means always remains in saturation, whereby the voltage at the current source transistors is maintained substantially constant in the face of changes in voltages at said ladder.

3. A DAC as set forth in claim 2, wherein said ladder output voltage is maintained within a range of values such that the drain electrode of the PMOS switch means does not become more positive than its gate electrode by an amount equal to the $V_{TBS}$ of the PMOS switch means.

4. A DAC as set forth in claim 2, wherein the full-scale output voltage of said ladder is set at a level of approximately 1.25 volts.

5. A digital-to-analog converter (DAC) with means to receive a binary input code and including a plurality of identical high-speed DAC cells each developing a continuous current output for selective connection to a corresponding input node of an R/2R ladder network to produce on the ladder output line a composite analog signal corresponding to the input code;

each of said identical DAC cells comprising:
(A) a PNP bipolar transistor having its emitter connected through a resistor to a d-c supply line the voltage of which differs from that of the base voltage of the transistor in a predeterminedly controlled fashion so that said bipolar transistor serves as a precision current source;
(B) PMOS switch means with an input terminal connected to the collector of said bipolar transistor to receive said continuous output current, said switch means having first and second output terminals alternatively connectable to said switch means input terminal to carry said continuous output current, said first and second output terminals being connected respectively to (1) a common reference line and (2) a corresponding input node of said R/2R ladder; and
(C) circuit means responsive to said input code for controlling the conditioning of the corresponding PMOS switch means to activate a selected one of said output terminals to carry said continuous current of the corresponding bipolar current source either to said common reference line or to the corresponding ladder input node;

said PMOS switch means for each DAC cell comprising a make-before-break switch circuit wherein upon activation of the switch means a conducting path circuit is established between said input terminal and a selected output terminal before the previously-established conducting path between said input terminal and the other output terminal is interrupted.

6. A DAC as set forth in claim 5, wherein said PMOS switch means comprises a pair of PMOS switches having a common input terminal and separate output terminals; and
switch control means operable during switch activation to close the newly-activated switch before the other switch to deactivated.

7. A digital-to-analog converter (DAC) with means to receive a binary input code and including a plurality of identical high-speed DAC cells each developing a continuous current output for selective connection to a corresponding input node of an R/2R ladder network to produce on the ladder output line a composite analog signal corresponding to the input code;

each of said identical DAC cells comprising:
(A) a bipolar transistor connected to first circuit means arranged so that said bipolar transistor serves as a current source;
(B) MOS switch means with an input terminal connected to the output of said bipolar transistor to receive said continuous output current, said MOS switch means having a channel polarity which is the same as the polarity of the collector/emitter of said bipolar transistor, said switch means further having first and second output terminals alternatively connectable to said switch means input terminal to carry said continuous output current, said first and second output terminals being connected respectively to (1) a common reference line and (2) a corresponding input node of said R/2R ladder; and
(C) second circuit means responsive to said input code for controlling the conditioning of the corresponding MOS switch means to active a selected one of said output terminals to carry said continuous current of the corresponding bipolar current source either to said common reference line or to the corresponding ladder input node;

the range of output voltages developed by said ladder being maintained within a predetermined range of values such that said MOS switch means remains in saturation, whereby the voltage at the current source transistors is maintained substantially constant in the face of changes in voltages at said ladder.

8. A DAC as set forth in claim 7, wherein said ladder output voltage is maintained within a range of values such that the potential of the output electrode of the MOS switch means does not differ from its gate electrode by more than an amount equal to the $V_{TBS}$ of the MOS device.

9. A DAC as set forth in claim 7, wherein the full-scale output voltage of said ladder is set at a level no greater than approximately 1.25 volts.

* * * * *